United States Patent
Arsovski et al.

(10) Patent No.: US 9,088,277 B2
(45) Date of Patent: Jul. 21, 2015

(54) LEAKAGE REDUCTION IN OUTPUT DRIVER CIRCUITS

(71) Applicant: International Business Machines Corporation, Armonk, NY (US)

(72) Inventors: Igor Arsovski, Williston, VT (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 14/074,926

(22) Filed: Nov. 8, 2013

(65) Prior Publication Data

US 2015/0130510 A1      May 14, 2015

(51) Int. Cl.
| | |
|---|---|
| *H03K 19/0175* | (2006.01) |
| *H03K 19/096* | (2006.01) |
| *H03K 19/0944* | (2006.01) |
| *H03K 19/00* | (2006.01) |
| *H03K 5/135* | (2006.01) |

(52) U.S. Cl.
CPC ........ *H03K 19/0013* (2013.01); *H03K 19/0944* (2013.01); *H03K 19/0963* (2013.01); *H03K 5/135* (2013.01)

(58) Field of Classification Search
CPC .............. H04L 25/0272; H04L 25/028; H04L 25/0292; H03K 19/0963; H03K 5/135; G06F 1/10
USPC .......... 326/93, 95, 82, 83; 327/208–212, 214, 327/215; 365/203
See application file for complete search history.

(56) References Cited

U.S. PATENT DOCUMENTS

| | | | |
|---|---|---|---|
| 6,373,738 B1 | 4/2002 | Towler et al. | |
| 6,429,689 B1 * | 8/2002 | Allen et al. | 326/95 |
| 6,693,461 B2 * | 2/2004 | Hsu et al. | 326/95 |
| 6,697,277 B2 | 2/2004 | Towler et al. | |
| 7,268,590 B2 * | 9/2007 | Kao et al. | 326/95 |
| 7,286,379 B1 | 10/2007 | Sun | |
| 7,729,150 B2 | 6/2010 | Sarin et al. | |
| 7,751,218 B2 * | 7/2010 | Arsovski | 365/49.17 |
| 7,764,087 B2 | 7/2010 | Kursun et al. | |
| 7,777,523 B1 | 8/2010 | Masleid et al. | |
| 7,852,652 B1 | 12/2010 | Fabry | |
| 7,855,578 B2 * | 12/2010 | Kursun et al. | 326/98 |

(Continued)

OTHER PUBLICATIONS

Chang, "Using the Dynamic Power Source Technique to Reduce TCAM Leakage Power.", IEEE Transactions on Circuits and Systems—II: Express Briefs, vol. 57, No. 11, Nov. 2010, pp. 888-892, 2010 IEEE.

(Continued)

*Primary Examiner* — Dylan White
(74) *Attorney, Agent, or Firm* — Keivan Razavi; David Cain

(57) ABSTRACT

An output driver circuit may include a electrically conductive medium, an output logic inverter having a first switch adapted to couple a first positive supply voltage to the electrically conductive medium and a second switch adapted to couple a ground supply voltage to the conductive medium. A first biasing network includes a first input that is coupled to the conductive medium, a second input that receives a clock signal, and a first output that is adapted to couple a second positive supply voltage to each input of the first and the second switch. Based on the second switch coupling the conductive medium to the ground supply voltage and the received clock signal generating a logic low, the biasing network reverse biases the first switch by coupling the second positive supply voltage to the respective input of the first switch causing a leakage current reduction in the first switch.

15 Claims, 5 Drawing Sheets

(56) References Cited

U.S. PATENT DOCUMENTS 8,000,120 B2  8/2011  Wang et al.
2004/0263209 A1* 12/2004  Choe .............................. 326/98
2012/0206951 A1  8/2012  Rachamadugu et al.

OTHER PUBLICATIONS

Huang et al., "Green" Micro-Architecture and Circuit Co-Design for Ternary Content Addressable Memory, 978-1-4244-1684-4/08/$25.00 2008 IEEE, pp. 3322-3325.

Mohan et al., "Low-Leakage Storage Cells for Ternary Content Addressable Memories.", IEEE Transactions on Very Large Scale Integration (VLSI) Systems, vol. 17, No. 5, May 2009, pp. 604-612, 1063-8210/$25.00 2009 IEEE.

Mohan et al., "Novel Ternary Storage Cells and Techniques for Leakage Reduction in Ternary Cam.", 0-7803-9782-7/06/$20.00 2006 IEEE, pp. 311-314.

Kudithipudi et al., "On Estimation of Static Power-Performance in TCAM.", 978-1-4244-2167-1/08/$25.00 2008 IEEE, pp. 783-786.

* cited by examiner

US 9,088,277 B2

LEAKAGE REDUCTION IN OUTPUT DRIVER CIRCUITS

BACKGROUND a. Field of the Invention

The present invention generally relates to output driver circuits, and more particularly, to reducing leakage in output driver circuits.

b. Background of Invention

An associative memory system such as Content Addressable Memory (CAM) may facilitate its memory cells to be referenced by their contents. Thus, CAM may be utilized in, for example, lookup table implementations, networking system applications, pattern recognition, and data compression. Among other things, CAMs provide the ability to perform a fast search operation in which search data is compared with data stored within the CAM. Typically search data is loaded onto search lines and compared with stored words in the CAM. During a search-and-compare operation, the CAM may perform a fully parallel search and generate a match or mismatch signal associated with each stored word, indicating whether the search word matches a stored word or not.

In order to allow this fast parallel comparison between all stored words to a single search word, each CAM word may contain dedicated search hardware. Each CAM cell, therefore, contains additional bit-comparison transistors, in addition to a conventional storage element, which may typically be implemented as a Static Random Access Memory (SRAM) cell or a Dynamic Random Access Memory (DRAM) cell. This added circuitry is combined across the word with a match-line (ML) to produce a match or mismatch signal for each CAM word. Moreover, this search hardware allows the entire contents of the CAM memory to be searched in a single memory cycle.

Since, leakage power minimization is becoming increasingly important as technology nodes progress, leakage power reduction in each component on a chip may also be of significance. One major contributor to CAM leakage may be matchline output drivers, which ultimately drive the search results. For example, a Ternary CAM (TCAM) system may include 8096 matchlines and, therefore, 8096 output drivers, which may contribute to current leakage and increased power consumption. Furthermore, most of the TCAM matchlines typically drive a miss state or GND causing leakage in the PFET drivers of their output drivers.

BRIEF SUMMARY

According to one exemplary embodiment, an output driver circuit may include a electrically conductive medium; an output logic inverter stage having a first switch adapted to couple a first positive supply voltage to the electrically conductive medium and a second switch adapted to couple a ground supply voltage to the electrically conductive medium; a first biasing network having a first input that is coupled to the electrically conductive medium, a second input that receives a clock signal, and a first output that is adapted to couple a second positive supply voltage to each respective input of the first and the second switch, such that the second positive supply voltage is greater than the first positive supply voltage. Based on the second switch coupling the electrically conductive medium to the ground supply voltage and the received clock signal generating a logic low, the biasing network reverse biases the first switch by coupling the second positive supply voltage to the respective input of the first switch causing a leakage current reduction in the first switch.

According to another exemplary embodiment, a method of driving a electrically conductive medium using a logic inverter stage having a first and a second switch connected in series between a first positive supply voltage and a ground supply voltage is provided. The method may include applying a logic low to the electrically conductive medium using the first switch device; feeding back the logic low on the electrically conductive medium to an input of a third switch; applying a logic low clock signal to an input of a fourth switch; generating, using the third and the fourth switch, an electrical path between a second positive supply voltage and each respective input of the first and the second switch based on the applied logic low of the clock signal and the fed back logic low on the electrically conductive medium; and reverse biasing the second switch device by coupling the second positive supply voltage to the input of the second switch. The reverse bias may occur based on the first positive supply voltage and the second positive supply voltage being coupled to the second switch, whereby the reverse biased second switch causes a leakage current reduction in the second switch when the first switch applies the logic low to the electrically conductive medium.

According to yet another exemplary embodiment, a design structure tangibly embodied in a machine readable medium for designing, manufacturing, or testing an integrated circuit is provided. The design structure may include a electrically conductive medium; an output logic inverter stage having a first switch adapted to couple a first positive supply voltage to the electrically conductive medium and a second switch adapted to couple a ground supply voltage to the electrically conductive medium; a first biasing network having a first input that is coupled to the electrically conductive medium, a second input that receives a clock signal, and a first output that is adapted to couple a second positive supply voltage to each respective input of the first and the second switch, such that the second positive supply voltage being greater than the first positive supply voltage. Based on the second switch coupling the electrically conductive medium to the ground supply voltage and the received clock signal generating a logic low, the biasing network reverse biases the first switch by coupling the second positive supply voltage to the respective input of the first switch causing a leakage current reduction in the first switch.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
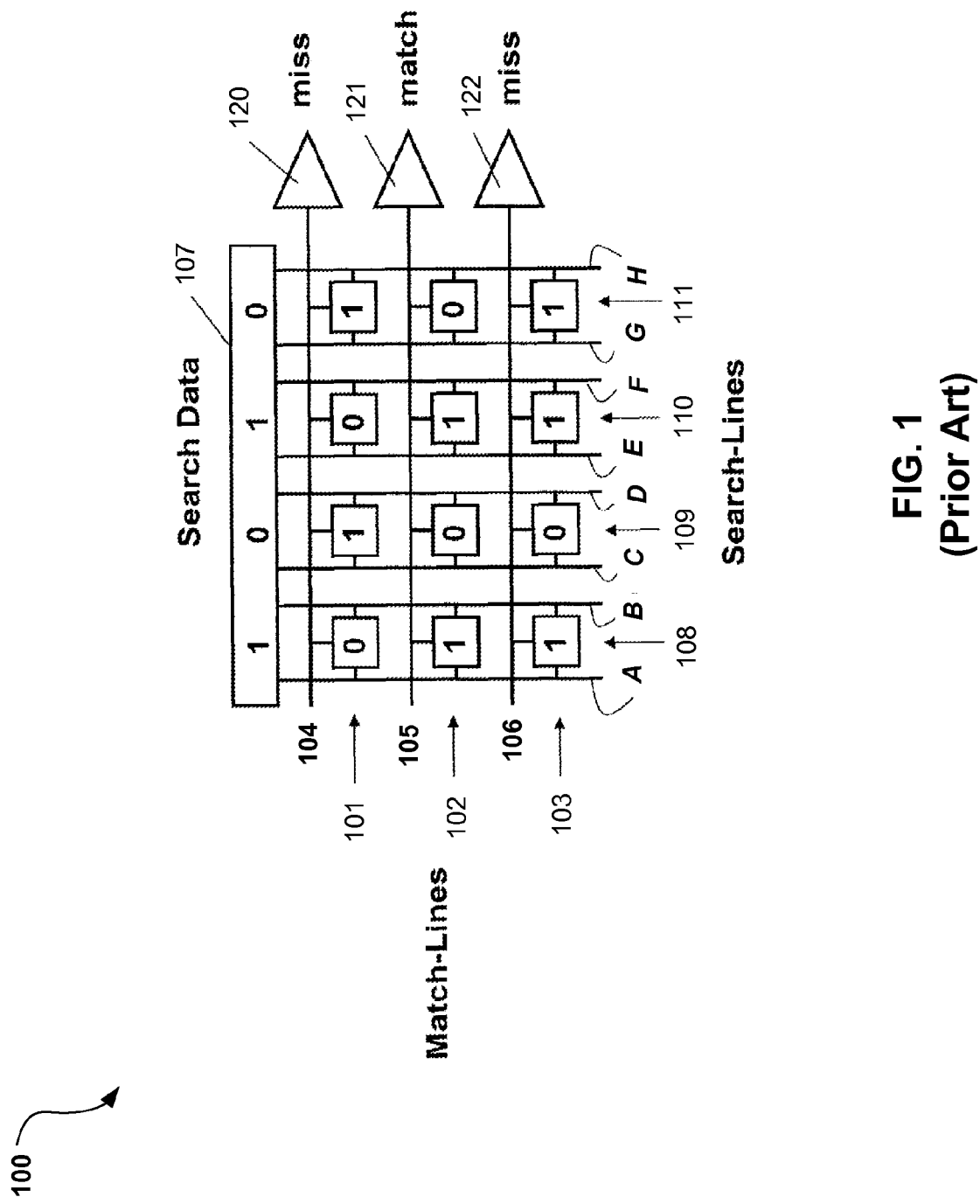
FIG. 1 illustrates an exemplary architecture for a conventional CAM arrangement.

Referring to FIG. 1, in a conventional CAM sensing exemplary architecture 100, CAM core cells may be arranged in horizontal rows 101, 102, 103, composed of, for example, four cells, whereby each of the CAM core cell of a respective horizontal row 101, 102, 103 are coupled to matchlines (MLs) 104, 105, 106. For example, the CAM core cells of row 101 are coupled to ML 104, the CAM core cells of row 102 are coupled to ML 105, and the CAM core cells of row 103 are coupled to ML 106. As depicted, for purposes of illustrative brevity, only a four-bit word associated with the horizontally arranged CAM core cells and three MLs 104-106 are shown. It may, however, be appreciated that any number of MLs and word lengths can be utilized.

As further depicted in FIG. 1, the CAM core cells are arranged in columns 108, 109, 110, and 111. While only four columns are shown, any number of columns corresponds to the number of bits (i.e., 4) in a CAM core cell word to be searched may be utilized. For example, '640' columns representative of a 640-bit word may be utilized. Search data 107 includes the word data to be searched and is provided for comparison with each word formed in CAM rows 101-103. Although three CAM rows 101-103 are depicted, for example, '2000' CAM rows and, thus, '2000' MLs may be utilized. Parallel search lines A-H are coupled to search data 107, and each CAM core cell in a respective column is coupled to two search lines so that each cell corresponding to a data bit of the search data 107 can be searched for a match. Search results develop on MLs 104-106 in parallel and are applied to respective output drivers 120-122.

As indicated, a match may occur between search data 107 and the CAM core cell word coupled to ML 105. Upon detection of such a match, output driver 121 may then transition to logic 1 (i.e., logic high), while the remaining output drivers 120, 122 generate a logic 0. Thus, in operation, when a match is found, most of the output drivers coupled to the MLs will be in a logic 0 state, which in turn may contribute to leakage current generation. Such leakage current generation is described below in relation to a convention driver circuit depicted in FIG. 2.

Figure 2:
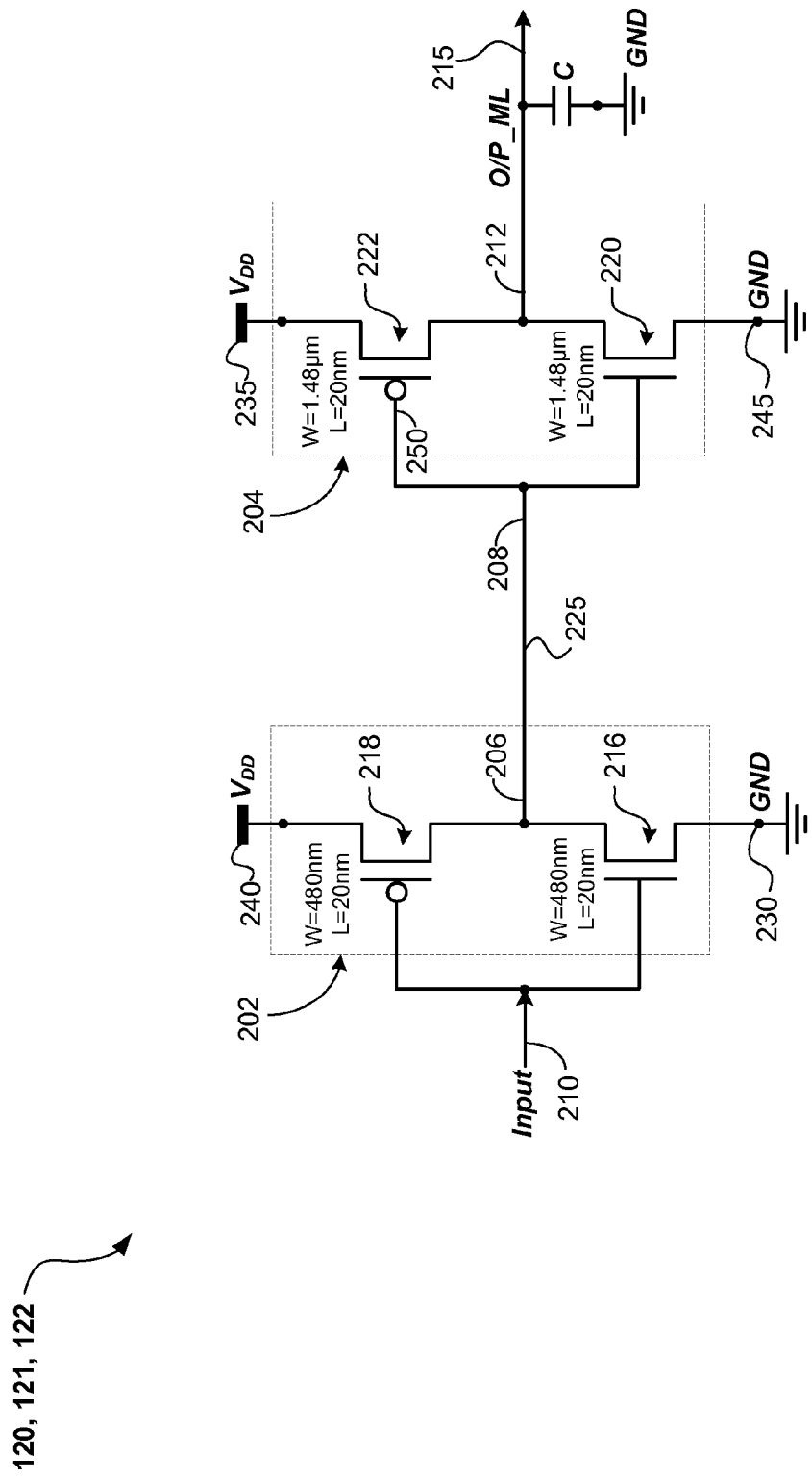
FIG. 2 is a circuit diagram of a conventional inverter-based output driver.

Referring to FIG. 2, a conventional output driver, such as each of output drivers 120, 121, and 122 (also see FIG. 1), may include two inverter stages 202 and 204 coupled in series, whereby the output 206 of inverter stage 202 is coupled to the input 208 of inverter stage 204. The depicted output driver includes two inverter states 202, 204 so that the logic level present at the input 210 to the output driver is the same as the logic level generated at the output 212 of the output driver. For example, a logic 0 at input 210 will generate a logic 0 at output 212, while a logic 1 at input 210 will accordingly generate a logic 1 at output 212.

Inverter stage 202 may include NFET device 216 and PFET device 218. Also, inverter stage 204 may include NFET device 220 and PFET device 222. In the depicted exemplary embodiment, inverter stage 204 may include wider FET devices 220, 222, as defined by W, compared to the FET devices 216, 218 associated with inverter stage 202. For example, FET devices 216 and 218 include a width W of about 480 nm, while FET devices 220 and 222 have widths W of about 1.48 μm. By increasing the device widths in the second inverter stage 204 (i.e., output logic inverter stage), the larger capacitive load C associated with the ML 215 can be driven by output 212. However, by widening the FET devices, leakage current is also increased.

In operation, when a logic 1 is applied to input 210 of inverter stage 202 (i.e., input logic inverter stage), NFET 216 is switched on, while PFET 218 is switched off. The output 206 of inverter stage 202 and, therefore, the input 208 of inverter stage 204 is held at a logic 0 based on the NFET 216 coupling electrical connection 225 to ground GND, as indicated at 230. Since the input 208 of inverter stage 204 is held at a logic 0, the PFET 222 of inverter stage 204 is switch on, while NFET 220 is switched off. The output 212 of inverter stage 204 and, therefore ML line 215 is held at a logic 1 based on the PFET 222 coupling the supply voltage $V_{DD}$, as indicated at 235, to ML line 215.

Alternatively, when a logic 0 is applied to input 210 of inverter stage 202, NFET 216 is switched off, while PFET 218 is switched on. The output 206 of inverter stage 202 and, therefore, the input 208 of inverter stage 204 is held at a logic 1 based on the PFET 218 coupling electrical connection 225 to the supply voltage $V_{DD}$, as indicated at 240. Since the input 208 of inverter stage 204 is held at a logic 1, the NFET 220 of inverter stage 204 is switch on, while PFET 222 is switched off. The output 212 of inverter stage 204 and, therefore ML line 215 is held at a logic 0 based on the NFET 220 coupling the ML line 215 to ground GND, as indicated at 245.

Although the ML line 215 is coupled to ground GND, some leakage current flow through the turned-off PFET 222 to output 212 and, therefore ML line 215, may occur regardless of the input 250 of PFET 222 being turned off. In a typical CAM architecture, there may be, for example, '2000' MLs that each has an output driver such as output driver 120-122. Due to the nature of the CAM function, many of the MLs (e.g., about 90%) in a CAM architecture may be held at logic 0 by their respective output drivers, based on the occurrence of a miss (i.e., no word match for that ML). Only a limited number of MLs may transition to logic 1 by their respective output driver, based on the occurrence of a word match (i.e., a word match found on the ML). Therefore, out of '2000' MLs, about 1800MLs (e.g., 90%) may be generating leakage current as their respective output drivers hold the ML lines at logic 0.

As previously described, PFET 222 may not be perfectly turned off when a logic 0 is received at input 210. Particularly:

$$V_{GS}=V_G-V_S \quad \text{(Equation 1)}$$

Using Equation 1, for PFET 222, $V_G$ is held at $V_{DD}$ based on the output 206 of inverter stage 202 being held at logic 1. Also, $V_S$ for PFET 222 is held at $V_{DD}$. Thus, $V_{GS}$ is about 0V. Based on the PFET having a threshold voltage of $V_t$, the voltage input driving PFET 222 may be approximately $V_{GS}-V_t$, which is $0-V_t=-V_t$. PFET 222 is accordingly turned off by $-V_t$. Although turned off, the PFET device 222 may still contribute to generating leakage current. The following one or more exemplary embodiments thus illustrate and describe feedback circuitry that may provide reverse biasing voltages across FET devices (e.g., PFET 222) that drive electrical signal lines such as ML lines (e.g., ML 215) for leakage reduction purposes.

Figure 3:
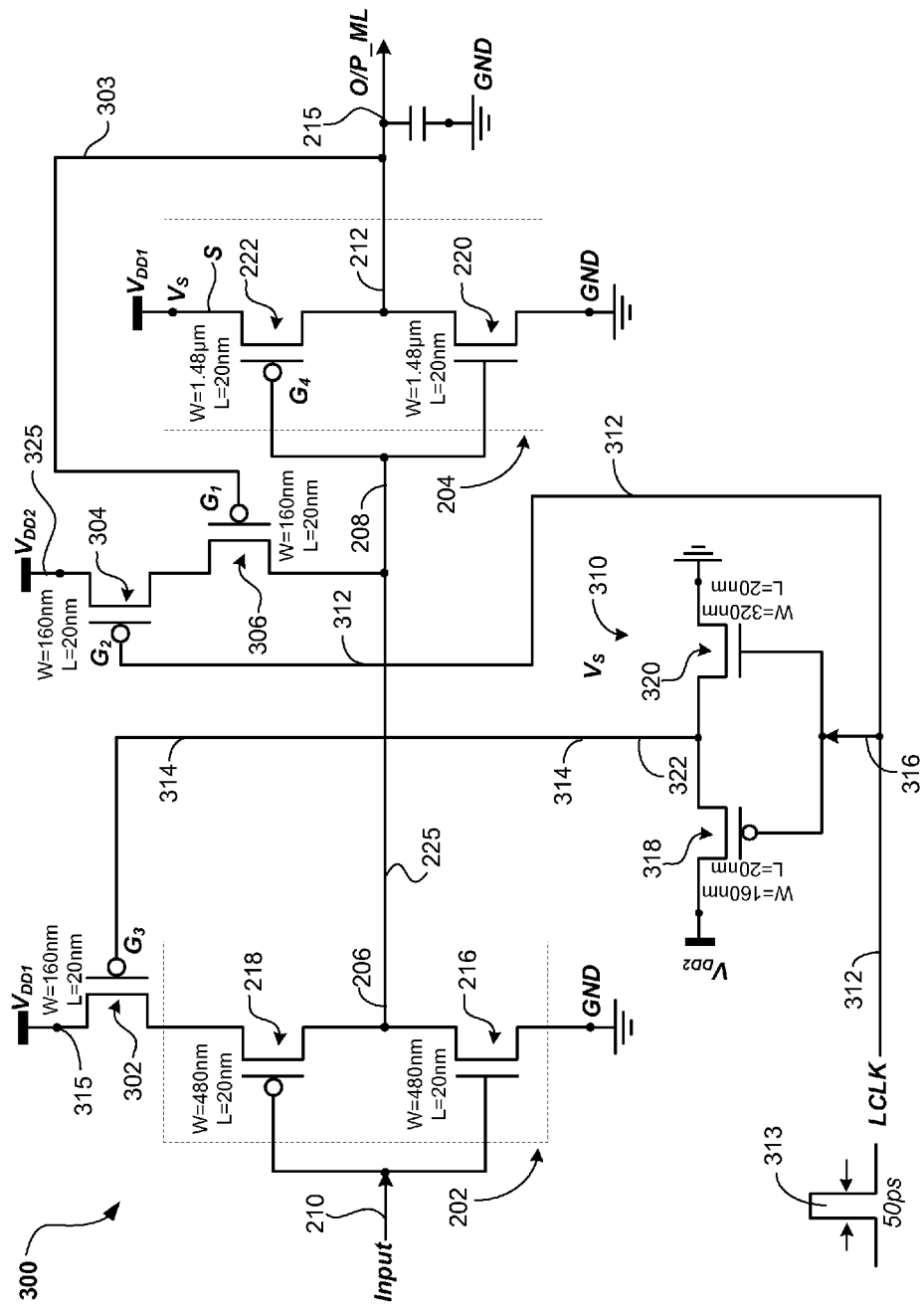
FIG. 3 is a circuit diagram of an inverter-based output driver according to one embodiment.

FIG. 3 is a circuit diagram of an inverter-based output driver 300 according to one embodiment. As depicted, output driver 300 includes inverter stages 202 and 204, which are identical to, or substantially the same as, the inverter stages depicted in FIG. 2. Output driver 300 further includes a PFET device 302 that is coupled between supply voltage $V_{DD1}$ at 315 and PFET 218; and a broken feedback circuit that includes feedback connection 303, PFET 304, and PFET 306. As depicted, the feedback connection 303 is coupled to the gate $G_1$ of PFET 306, while PFETs 304 and 306 are connected in series between supply voltage $V_{DD2}$ at 325 and input 208 of the inverter stage 204. The feedback connection 303 may be broken when PFET 304 is turned OFF during an update operation. Alternatively, the feedback connection 303 may be active when PFETs 304 and 306 are turned ON during a static (i.e., no update) operation. A more detailed description of the static and update functions associated with output driver 300 is presented in the following paragraphs. The supply voltages $V_{DD1}$, $V_{DD2}$ may include separate supply voltages whereby $V_{DD2}$ is greater than $V_{DD1}$.

The output driver 300 also operates in conjunction with a clocking source 310. The clocking source 310 may be shared among all output drivers and provides a clock signal 312 and an inverted (i.e., complementary) version of the clock signal 314 to the output drivers. The clock signal 312 is received by the input 316 of the clocking source 310. Since the clocking source 310 is an inverter formed by PFET device 318 and NFET device 320, the clock signal 312 received at the input 316 to the clocking source 310 is inverted at the output 322 of the clocking source 310 in order to generate the inverted (i.e., complementary) clock signal 314. As depicted, the clock signal 312 at input 316 bypasses the clocking source 310 and is received by the gate $G_2$ of PFET 304. The inverted (i.e., complementary) clock signal 314 generated at the output 322 of the clocking source 310 is received by the gate $G_3$ of PFET 302. Thus, PFET 304 is driven by the clock signal 312 and PFET 302 is driven by the inverted clock signal 314.

In operation, typically two modes may exist. A first mode of operation is an update which is activated upon each pulse period 313 of clock signal 312. The pulse period 313 of clock signal 312 may, for example, be approximately 50 ps. The other mode is a static mode, which applies when the clock signal 312 is at logic 0 (i.e., a logic low or no pulse transition). Because the update mode occurs for a relatively short period, the leakage current associated with the MLs that are held at logic 0 may be considered of little consequence. Therefore, in update mode, the output driver 300 is configured to function as a two-stage inverter having inverters 202 and 204, which operates as described above in relation to FIG. 2.

Thus, during an update, the 50 ps pulse generates a logic 1 at input 316 of the clocking source 310. The clocking source 310 then generates a logic 0 at output 322, which is coupled to gate $G_3$ of PFET 302. The generated logic 0, which is representative of inverted clock signal 314, switches PFET 302 ON and, therefore, couples supply voltage $V_{DD1}$ to the source of PFET 218. Since the logic 1 at input 316 of the clocking source 310 is also coupled to gate $G_2$ of PFET 304, PFET 304 remains switched OFF.

Thus, in such an operating mode (i.e., update), the output driver 300 functions as a driver including inverters 202 and 204, whereby no leakage minimization measures are incorporated. Specifically, if input 210 is at logic 1, ML line 215 is also held at logic 1 via PFET 222. Here, leakage may be of little concern. Alternatively, when input 210 is at logic 0, ML line 215 is also held at logic 0 via NFET 220. Here, leakage may occur through PFET 222. However, such exhibited leakage occurs over the relatively short 50 ps pulse period 313 during the update.

Alternatively, during a static mode, the clock is at a logic low and generates a logic 0 at input 316 of the clocking source 310. The clocking source 310 accordingly generates a logic 1 at output 322, which is coupled to gate $G_3$ of PFET 302. The generated logic 1, which is representative of inverted clock signal 314, switches PFET 302 OFF and, therefore, isolates supply voltage $V_{DD1}$ from the source of PFET 218. Since the logic 0 at input 316 of the clocking source 310 is also coupled to gate $G_2$ of PFET 304, PFET 304 is switched ON. If, during the previous update, the input 210 was at logic 0, the output 206 of inverter stage 202 remains at logic 1 and, therefore, the input 208 of inverter stage 204 is also at logic 1. Based on the input 208 of inverter stage 204 being at logic 1, the output 212 of inverter stage 204 and, therefore, ML 215 is accordingly at logic 0.

As previously described, this condition, whereby the output 212 of the inverter stage 204 is at logic 0 through NFET 220, applies to a leakage current scenario via PFET 222. However, in this operating mode (i.e., static) the broken feedback circuit, provided by feedback connection 303, PFET 304, and PFET 306, generates a reverse bias condition across PFET 222. Particularly, since the clock signal 312 is at logic 0 and is applied to gate $G_2$ of PFET 304, PFET 304 is switched ON. Also, based on the logic 0 at output 212 of the inverter stage 204 being fed back via feedback connection 303 to gate $G_1$ of PFET 306, PFET 306 is also switched ON. PFET devices 304 and 306 may form a switched biasing network that is controlled by both the output 212 of the driver 300, and thus the ML's 215 logic state, and the input clock signal 312 to the driver 300. When both PFET devices 304, 306 are switched ON, the biasing network is accordingly switched ON. Thus, during this condition, the $V_{DD2}$ supply voltage is coupled to input 208 of inverter stage 204. Now, instead of the $V_{DD1}$ supply voltage being coupled to input 208 of inverter stage 204 via a logic 1 output from inverter stage 202, the increased supply voltage provided by $V_{DD2}$ is coupled to input 208 and, therefore, gate $G_4$ of PFET 222 of inverter stage 204. This accordingly causes a reverse bias across PFET 222. Based on the application of the reverse bias across PFET 222, the leakage current through the PFET 222 is thus reduced. Particularly, a reverse bias path is created between the $V_{DD2}$ supply voltage and the gate $G_4$ of PFET 222 via PFETs 304 and 306.

As previously described, under conventional operating conditions during, for example, an update, the output driver 300 is configured to function as a two-stage inverter having inverters 202 and 204, which accordingly operate in the manner described above in relation to FIG. 2. Thus, referring back to Equation (1) above, the voltage input driving PFET 222 may be approximately $V_{GS}-V_t$, whereby $V_{GS}=V_G-V_S$. Here, $V_G$ is now $V_{DD2}$ while $V_S$ is $V_{DD1}$. Therefore, $V_{GS}=V_{DD2}-V_{DD1}=+V$, where $+V$ is representative of a positive (+) voltage based on $V_{DD2}>V_{DD1}$. So, $V_{GS}-V_t$ is equivalent to $+V-V_t$. This means that a more positive voltage is now applied to the gate $G_4$ of PFET 222, which provides the reverse bias voltage across the device 222. This reverse bias is evident based on the voltage (i.e., $V_{DD2}$) applied to gate $G_4$ of PFET 222 being higher than the voltage (i.e., $V_{DD1}$) applied to the source (S) of PFET 222. For a PFET, the more positive the applied gate voltage, the more reversed biased and switched OFF is the device. Conversely, zero or negative voltages applied to the PFET gate may forward bias and switch ON the device. Here, by switching a path and coupling a higher supply voltage $V_{DD2}$ to the gate $G_4$ of PFET 222, the PFET 222 is reverse biased even more ($V_{GS}$ further positively increased), which in turn increasingly negates leakage current. Since most of the MLs (e.g., 90%) are held at logic 0 by their respective output driver, having an output driver such as output driver 300 enables a reduction in leakage current as a result of the reverse biasing of the PFET (e.g., PFET 222) of the output logic inverter stage (e.g., inverter 204).

Figure 4:
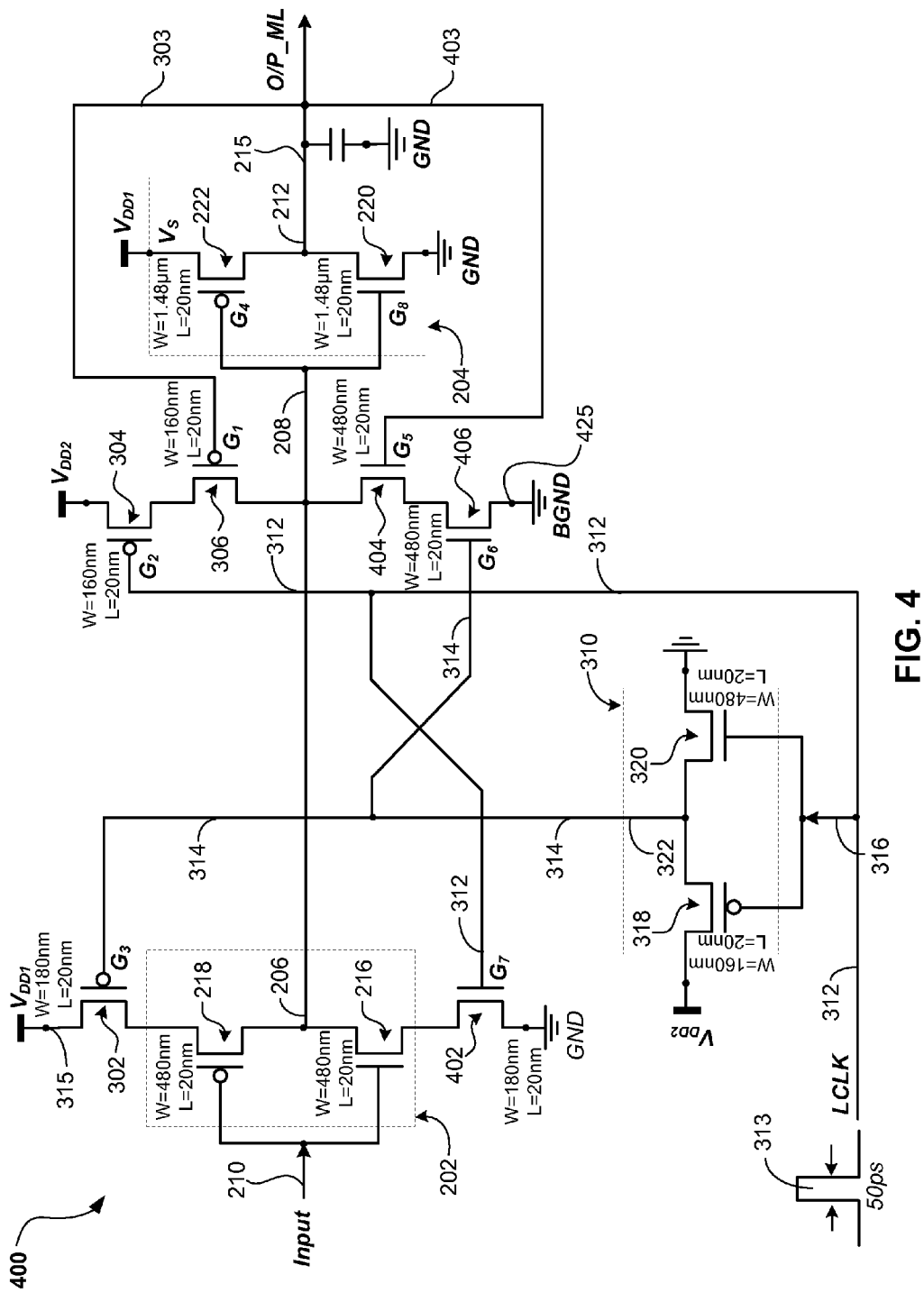
FIG. 4 is a circuit diagram of an inverter-based output driver according to another embodiment.

FIG. 4 is a circuit diagram of an inverter-based output driver 400 according to another embodiment. As depicted, output driver 400 also includes inverter stages 202 and 204, which are identical to, or substantially the same as, the inverter stages depicted in FIG. 2. Moreover, the inverter-based output driver 400 includes the same circuitry and operating principles as the inverter-based output driver 300 of FIG. 3 during the reverse biasing of the output stage PFET 222 when the corresponding ML 215 is held at logic 0. However, additionally, the inverter-based output driver 400 also facilitates leakage current minimization for the output stage NFET 220 when the corresponding ML 215 is held at logic 1. This may offer a benefit when, for example, the output driver 400 is driving a bus architecture or other electrically conductive medium that has a reasonable number of bus lines held at logic 1.

As depicted, output driver 400 also includes inverter stages 202 and 204, which are identical to, or substantially the same as, the inverter stages depicted in FIG. 2. Output driver 400 also includes PFET device 302 that is coupled between supply voltage $V_{DD1}$ at 315 and PFET 218; and a first broken feedback circuit that includes feedback connection 303, PFET 304, and PFET 306. As depicted, the feedback connection 303 is coupled to the gate $G_1$ of PFET 306, while PFETs 304 and 306 are connected in series between supply voltage $V_{DD2}$ at 325 and input 208 of the inverter stage 204. The feedback connection 303 may be broken when PFET 304 is turned OFF during the update operation. Alternatively, the feedback connection 303 may be active when PFETs 304 and 306 are turned ON during the static (i.e., no update) operation.

Output driver 400 also includes a second broken feedback circuit that includes feedback connection 403, NFET 404, and NFET 406. As depicted, the feedback connection 403 is coupled to the gate $G_5$ of NFET 404, while NFETs 404 and 406 are connected in series between below ground voltage BGND 425 and input 208 of the inverter stage 204. The feedback connection 403 may be broken when NFET 406 is turned OFF during an update operation. Alternatively, the feedback connection 403 may be active when NFETs 404 and 406 are turned ON during a static (i.e., no update) operation. A more detailed description of the static and update functions associated with output driver 400 is presented in the following paragraphs. The supply voltages $V_{DD1}$, $V_{DD2}$ may, as previously indicated, include separate supply voltages whereby $V_{DD2}$ is greater than $V_{DD1}$. Also, BGND is held to be below (i.e., more negative) ground GND or 0V.

The output driver 400 also operates in conjunction with a clocking source 310. The clocking source 310 may be shared among all output drivers and provides a clock signal 312 and an inverted (i.e., complementary) version of the clock signal 314 to the output drivers. The clock signal 312 is received by the input 316 of the clocking source 310. Since the clocking source 310 is an inverter formed by PFET device 318 and NFET device 320, the clock signal 312 received at the input 316 to the clocking source 310 is inverted at the output 322 of the clocking source 310 in order to generate the inverted (i.e., complementary) clock signal 314. As depicted, the clock signal 312 at input 316 bypasses the clocking source 310 and is received by the gate $G_2$ of PFET 304 and the gate $G_7$ of NFET 402. The inverted (i.e., complementary) clock signal 314 generated at the output 322 of the clocking source 310 is received by the gate $G_3$ of PFET 302 and gate $G_6$ of NFET 406. Thus, PFET 304 and NFET 402 are driven by the clock signal 312, while PFET 302 and NFET 406 are driven by the inverted clock signal 314.

As previously indicated, in operation, typically two modes may exist, whereby the first mode of operation is the update which is activated upon each pulse period 313 of clock signal 312. The pulse period 313 of clock signal 312 may, for example, be approximately 50 ps. The other mode is the static mode, which applies when the clock signal 312 is at logic 0 (i.e., no pulse transition). Because the update mode occurs for a relatively short period, the leakage current associated with the MLs that are held at logic 0 may be considered of little consequence. Therefore, in update mode, the output driver 400 is configured to function as a two-stage inverter having inverters 202 and 204, which operate as described above in relation to FIG. 2.

Thus, during the update, the 50 ps pulse generates a logic 1 at input 316 of the clocking source 310. The clocking source 310 then generates a logic 0 at output 322, which is coupled to both gate $G_3$ of PFET 302 and gate $G_6$ of NFET 406. The generated logic 0, which is representative of inverted clock signal 314, switches PFET 302 ON and NFET 406 OFF. Thus, supply voltage $V_{DD1}$ is coupled to the source of PFET 218 and the BGND ground voltage at 425 is isolated from the drain of NFET 404. Since the logic 1 at input 316 of the clocking source 310 is also coupled to gate $G_2$ of PFET 304 and gate $G_7$ of NFET 402, PFET 304 remains switched OFF while NFET 402 is switched ON.

Thus, in such an operating mode (i.e., update), the output driver 400 functions as a driver including inverters 202 and 204, whereby no leakage minimization measures are incorporated. Specifically, if input 210 is at logic 1, ML line 215 is also held at logic 1 via PFET 222. Here, leakage may be of little concern. Alternatively, when input 210 is at logic 0, ML line 215 is also held at logic 0 via NFET 220. Here, leakage may occur through PFET 222. However, such exhibited leakage occurs over the relatively short 50 ps pulse period 313 during the update.

Alternatively, during the static mode, the clock is at a logic low and generates a logic 0 at input 316 of the clocking source 310. The clocking source 310 accordingly generates a logic 1 at output 322, which is coupled to both gate $G_3$ of PFET 302 and gate $G_6$ of NFET 406. The generated logic 1, which is representative of inverted clock signal 314, switches PFET 302 OFF and NFET 406 ON. Thus, PFET 302 isolates supply voltage $V_{DD1}$ from the source of PFET 218, while NFET 406 couples the drain of NFET 404 to BGND ground at 425.

Since the logic 0 at input 316 of the clocking source 310 is coupled to gate $G_2$ of PFET 304, PFET 304 is switched ON. If, during the previous update, the input 210 was at logic 0, the output 206 of inverter stage 202 remains at logic 1 and, therefore, the input 208 of inverter stage 204 is also at logic 1. Based on the input 208 of inverter stage 204 being at logic 1, the output 212 of inverter stage 204 and, therefore, ML 215 is accordingly at logic 0. The logic 0 at input 316 of the clocking source 310 is also coupled to gate $G_7$ of NFET 402. Thus, NFET 402 is switch OFF and isolates the ground voltage at 415 from the drain of NFET 216.

As previously described, this condition, whereby the output 212 of the inverter stage 204 is at logic 0 through NFET 220, applies to a leakage current scenario via PFET 222. However, in this operating mode (i.e., static) the broken feedback circuit, provided by feedback connection 303, PFET 304, and PFET 306, generates a reverse bias condition across PFET 222. Particularly, since the clock signal 312 is at logic 0 and is applied to gate $G_2$ of PFET 304, PFET 304 is switched ON. Also, based on the logic 0 at output 212 of the inverter stage 204 being fed back via feedback connection 303 to gate $G_1$ of PFET 306, PFET 306 is also switched ON. PFET devices 304 and 306 may form a biasing network that is controlled by both the output 212 of the driver 300, and thus the ML's 215 logic state, and the input clock signal 312 to the driver 300. When both PFET devices 304, 306 are switched ON, the biasing network is accordingly switched ON. Thus, during this condition, the $V_{DD2}$ supply voltage is coupled to input 208 of inverter stage 204. Now, instead of the $V_{DD1}$ supply voltage being coupled to input 208 of inverter stage 204, the increased supply voltage provided by $V_{DD2}$ is coupled to input 208 and, therefore, gate $G_4$ of PFET 222 of inverter stage 204. This accordingly causes a reverse bias across PFET 222. Based on the reverse bias across PFET 222, the leakage current through the PFET 222 is accordingly reduced.

Further, based on the logic 0 at output 212 of the inverter stage 204 being fed back via feedback connection 403 to gate $G_5$ of NFET 404, NFET 404 is switched OFF. Also, since the inverted version of the clock signal 314 is at logic 1 and is applied to gate $G_6$ of NFET 406, NFET 406 is switched ON. However, the feedback connection is broken as a result of NFET 404 being OFF. Moreover, NFET devices 404 and 406 may form a switched biasing network that is controlled by both the output 212 of the driver 400, and thus the ML's 215 logic state, and the output clock signal 314 from clocking source 310.

When both NFET devices 404, 406 are switched ON, the biasing network is accordingly switched ON and, therefore, input 208 and consequently the gate $G_8$ of NFET 220 is negatively biased by establishing an electrical connection between BGND 425 (i.e., below ground voltage) and gate $G_8$ of NFET 220 via conducting NFETs 404 and 408. This negative biasing of the NFET 220 causes a reduction in leakage current when the NFET 220 is switched OFF based on output 212 being held at logic 1. More particularly, during the static operation, the inverted version of the clock signal 314 is at a logic 1 and received by the gate $G_6$ of NFET 406. This causes NFET 406 to switch ON. If the output 212 of the inverter stage 204 (or driver output) and thus the ML 215 is also at logic 1, the positive voltage of this logic 1 at gate $G_5$ of NFET 404 causes the NFET 404 to switch ON. Therefore, a reverse bias path is created between BGND 425 and NFET 220 via NFETs 404 and 408, which are both switched ON.

Thus, the embodiment of FIG. 4 provides leakage minimization during the static operating mode (i.e., clock 312 at logic 0) for instances where either PFET 222 is OFF (i.e., NFET 220 ON) or NFET 220 is OFF (i.e., PFET 222 ON). This provides additional leakage current minimization during instances (i.e., NFET 220 is OFF) when the ML 215 is held at logic 1 via PFET 222. This may be advantageous for bus architectures that are held at logic 1 with more regularity than, for example, MLs that are mostly held at logic 0. In contrast, the embodiment of FIG. 3 provides leakage minimization during the static operating mode (i.e., clock 312 at logic 0) for instances where only PFET 222 is OFF (i.e., NFET 220 ON). This is, as previously discussed, due to the MLs mostly being held at logic 0 via NFET 220 while PFET 222 is OFF. In both embodiments, PFET 222 and NFET 220 include the output logic inverter stage 204 of output drivers 300 (FIG. 3) & 400 (FIG. 4). PFET 222 holds the output 212 and, therefore, ML 215 at logic 1, while NFET 220 holds the output 212 and, therefore, ML 215 at logic 0.

Although, the exemplary embodiments of FIGS. 3 & 4 are described in relation to CAM match-lines (ML), the output drivers 300 (FIG. 3) & 400 (FIG. 4) may be used to drive any electrically conductive medium such as, for example, data and/or address bus architectures, transmission lines, etc. Thus, the exemplary output driver 300 (FIG. 3), 400 (FIG. 4) embodiments facilitate a reduction in leakage current and overall device power consumption.

Figure 5:
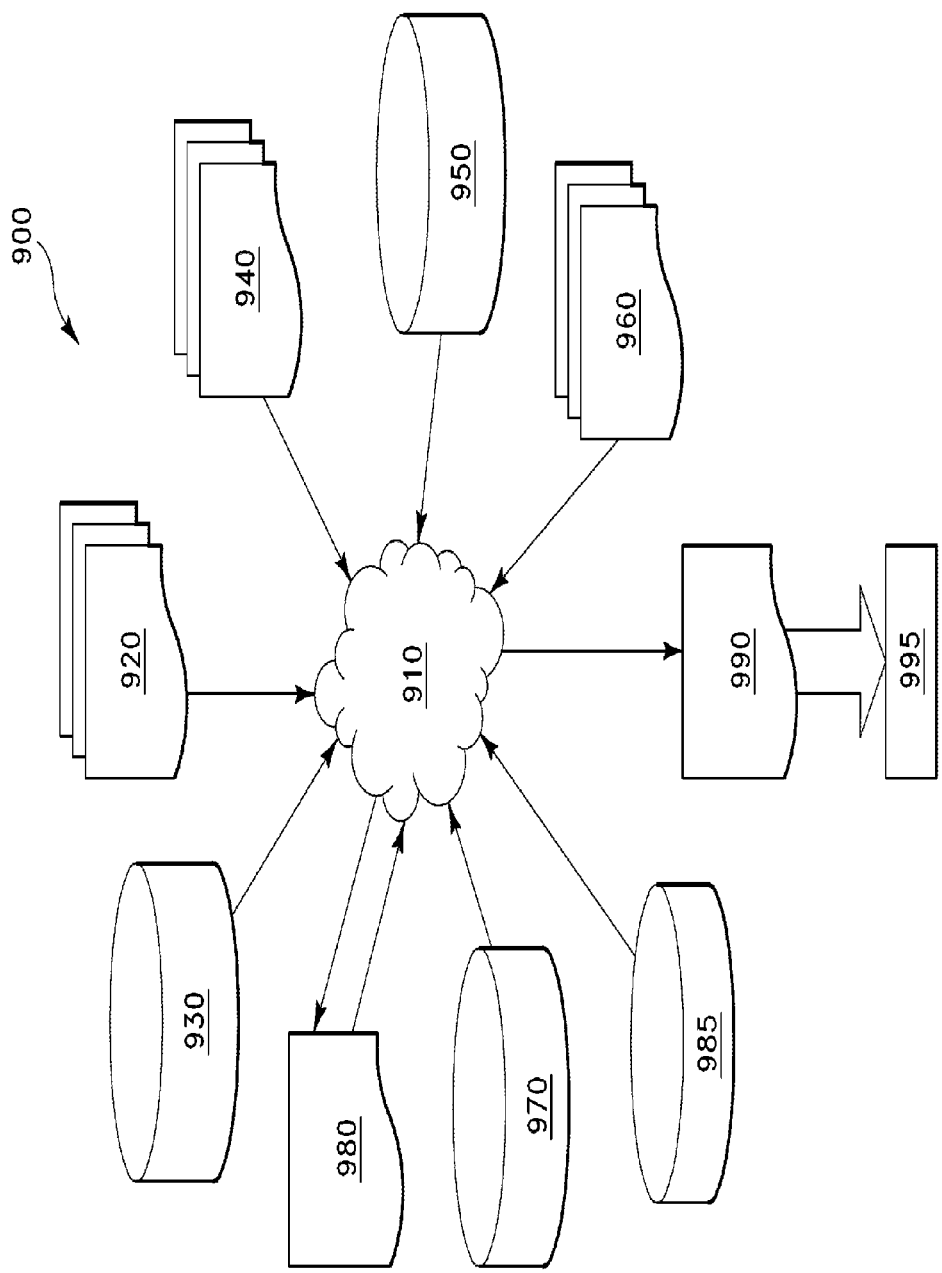
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 3 and 4. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 3 and 4. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention shown in FIGS. 3 and 4. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown in FIGS. 3 and 4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIGS. 3 and 4 to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 3 and 4. In one embodiment, design structure 990 may comprise a compiled, executable HDL simulation model that functionally simulates the devices shown in FIGS. 3 and 4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 3 and 4. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. An output driver circuit comprising:
   an electrically conductive medium;
   an output logic inverter stage having a first switch adapted to couple a first positive supply voltage to the electrically conductive medium and a second switch adapted to couple a ground supply voltage to the electrically conductive medium;
   a first biasing network having a first input that is coupled to the electrically conductive medium, a second input that receives a clock signal, and a first output that is adapted to couple a second positive supply voltage to each respective input of the first and the second switch, the second positive supply voltage being greater than the first positive supply voltage,
   wherein, based on the second switch coupling the electrically conductive medium to the ground supply voltage and the received clock signal generating a logic low, the first biasing network reverse biases the first switch by coupling the second positive supply voltage to the respective input of the first switch causing a leakage current reduction in the first switch;
   a clocking source that receives the clock signal and generates an inverted version of the clock signal, wherein the clocking source includes a logic inverter;
   an input logic inverter stage coupled to the output logic inverter stage, the input logic inverter stage having a fifth switch adapted to couple the first positive supply voltage to the each respective input of the first and the second switch, and a sixth switch adapted to couple the ground supply voltage to the each respective input of the first and the second switch; and
   a seventh switch coupled between the first positive supply voltage and the fifth switch, wherein the seventh switch receives the inverted version of the clock signal.

2. The circuit of claim 1, wherein the first switch comprises a PFET device and the second switch comprises a NFET device.

3. The circuit of claim 2, wherein the first biasing network comprises a third and a fourth switch connected in series between the second positive supply voltage and the each respective input of the first and the second switch, the third switch receiving the clock signal and the fourth switch being coupled to the electrically conductive medium.

4. The circuit of claim 3, wherein the third and the fourth switch comprise PFET devices.

5. The circuit of claim 2, wherein the electrically conductive medium comprises a match line associated with a content addressable memory (CAM) architecture.

6. The circuit of claim 1, wherein the fifth switch comprises a PFET device and the sixth switch comprises a NFET device.

7. The circuit of claim 1, further comprising:
a second biasing network having a third input that is coupled to the electrically conductive medium, a fourth input that receives an inverted version of the clock signal, and a second output that is adapted to couple a below ground supply voltage to each respective input of the first and the second switch, the below ground supply voltage being less than the ground supply voltage.

8. The circuit of claim 7, wherein the second biasing network comprises a third and a fourth switch connected in series between the below ground supply voltage and the each respective input of the first and the second switch, the third switch receiving the inverted version of the clock signal and the fourth switch being coupled to the electrically conductive medium.

9. The circuit of claim 8, wherein the third and the fourth switch comprise NFET devices.

10. A method of driving an electrically conductive medium using a logic inverter stage having a first and a second switch connected in series between a first positive supply voltage and a ground supply voltage, the method comprising:
applying a logic low to the electrically conductive medium using the first switch device;
feeding back the logic low on the electrically conductive medium to an input of a third switch;
applying a logic low clock signal to an input of a fourth switch;
generating, using the third and the fourth switch, an electrical path between a second positive supply voltage and each respective input of the first and the second switch based on the applied logic low of the clock signal and the fed back logic low on the electrically conductive medium;
reverse biasing the second switch device by coupling the second positive supply voltage to the input of the second switch, the reverse bias occurring based on the first positive supply voltage and the second positive supply voltage being coupled to the second switch,
wherein the reverse biased second switch causes a leakage current reduction in the second switch when the first switch applies the logic low to the electrically conductive medium; applying a logic high to the electrically conductive medium using the second switch device;
feeding back the logic high on the electrically conductive medium to an input of a fifth switch;
applying a logic high inverted version of the clock signal to an input of a sixth switch;
generating, using the fifth and the sixth switch, an electrical path between a below ground supply voltage and each respective input of the first and the second switch based on the applied logic high of the inverted version of the clock signal and the fed back logic high on the electrically conductive medium; and reverse biasing the first switch device by coupling the below ground supply voltage to the input of the first switch, the reverse bias occurring based on the ground supply voltage and the below ground supply voltage being coupled to the first switch,
wherein the reverse biased first switch causes a leakage current reduction in the first switch when the second switch applies the logic high to the electrically conductive medium.

11. The method of claim 10, wherein the first switch comprises a NFET device and the second switch comprises a PFET device.

12. The method of claim 11, wherein the NFET device applies the logic low to the electrically conductive medium by coupling the electrically conductive medium to the ground supply voltage when the PFET device is switched OFF, and wherein the PFET device applies a logic high to the electrically conductive medium by coupling the electrically conductive medium to the first positive supply voltage when the NFET device is switched OFF.

13. The method of claim 10, wherein the second positive supply voltage is greater than the first positive supply voltage.

14. The method of claim 10, wherein the third and the fourth switches comprise PFET devices.

15. An output driver circuit comprising:
an electrically conductive medium;
an output logic inverter stage having a first switch adapted to couple a first positive supply voltage to the electrically conductive medium and a second switch adapted to couple a ground supply voltage to the electrically conductive medium;
a first biasing network having a first input that is coupled to the electrically conductive medium, a second input that receives a clock signal, and a first output that is adapted to couple a second positive supply voltage to each respective input of the first and the second switch, the second positive supply voltage being greater than the first positive supply voltage,
wherein, based on the second switch coupling the electrically conductive medium to the ground supply voltage and the received clock signal generating a logic low, the biasing network reverse biases the first switch by coupling the second positive supply voltage to the respective input of the first switch causing a leakage current reduction in the first switch; and
a second biasing network having a third input that is coupled to the electrically conductive medium, a fourth input that receives the inverted version of the clock signal, and a second output that is adapted to couple a below ground supply voltage to each respective input of the first and the second switch, the below ground supply voltage being less than the ground supply voltage.

* * * * *